United States Patent
Xi et al.

(10) Patent No.: US 8,102,691 B2
(45) Date of Patent: Jan. 24, 2012

(54) MAGNETIC TRACKS WITH DOMAIN WALL STORAGE ANCHORS

(75) Inventors: Haiwen Xi, Prior Lake, MN (US); Xiaobin Wang, Chanhassen, MN (US); Dimitar V. Dimitrov, Edina, MN (US); Paul E. Anderson, Eden Prairie, MN (US); Harry Liu, Maple Grove, MN (US); Song S. Xue, Edina, MN (US); Andreas Roelofs, Eden Prairie, MN (US); Markus Siegert, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 764 days.

(21) Appl. No.: 12/144,705

(22) Filed: Jun. 24, 2008

(65) Prior Publication Data
US 2009/0316462 A1 Dec. 24, 2009

(51) Int. Cl.
*G11C 19/00* (2006.01)
(52) U.S. Cl. ............ 365/81; 365/148; 365/158; 365/87; 365/171; 977/933
(58) Field of Classification Search .................. 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | | |
|---|---|---|---|---|
| 6,834,005 | B1* | 12/2004 | Parkin | 365/80 |
| 6,898,132 | B2* | 5/2005 | Parkin | 365/189.12 |
| 6,920,062 | B2* | 7/2005 | Parkin | 365/158 |
| 7,031,178 | B2* | 4/2006 | Parkin | 365/80 |
| 7,236,386 | B2* | 6/2007 | Parkin | 365/80 |
| 7,514,271 | B2* | 4/2009 | Gaidis et al. | 438/3 |
| 2008/0080234 | A1* | 4/2008 | Iwata et al. | 365/171 |
| 2008/0138659 | A1* | 6/2008 | Lim et al. | 428/810 |
| 2009/0207718 | A1* | 8/2009 | Joe et al. | 369/126 |
| 2010/0073984 | A1 | 3/2010 | Xi | |

OTHER PUBLICATIONS

Numata et al., Scalable Cell Technology Utilizing Domain Wall Motion for High-Speed MRAM, 2007 Symposium on VLSI Technology Digest of Technical Papers, pp. 232-233.

* cited by examiner

*Primary Examiner* — Richard Elms
*Assistant Examiner* — Harry W Byrne
(74) *Attorney, Agent, or Firm* — Mueting Raasch & Gebhardt PA

(57) ABSTRACT

Magnetic shift registers in which data writing and reading is accomplished by moving the magnetic domain walls by electric current. Various embodiments of domain wall nodes or anchors that stabilize a domain wall are provided. In some embodiments, the wall anchors are elements separate from the magnetic track. In other embodiments, the wall anchors are disturbances in the physical configuration of the magnetic track. In still other embodiments, the wall anchors are disturbances in the material of the magnetic track.

24 Claims, 5 Drawing Sheets

MAGNETIC TRACKS WITH DOMAIN WALL STORAGE ANCHORS

BACKGROUND

In recent years, the commercial market for memory has gradually shift from that for personal, desk top computers to consumer devices such as handheld or portable music players, communication devices, computing devices, and combinations of these features in one device. Due to the smaller and smaller size of these portable devices, memory with higher density and speed, lower power consumption, and small size is in high demand.

Extensive development has been directed to non-volatile memory devices including FLASH, polymer random access memory (RAM), magnetic RAM (MRAM), ferroelectric RAM (FeRAM) and resistance RAM (RRAM). Magnetic shift registers have been proposed as an alternative to these RAM devices, as magnetic shift registers can store and access a large number of data bits using just a few logic elements and a low cost.

To facilitate the storage of data in magnetic shift registers, embodiments of shift registers that include indentations or protrusions into the width of the track to support a domain wall have been proposed. The indentations and protrusions, however, are difficult to form in the shift registers and are hard to control. What is needed is a system to provide better stability to domain walls and a better process to provide the stability.

BRIEF SUMMARY

The present disclosure relates to magnetic shift registers or shift tracks, in which data writing and reading is accomplished by moving magnetic domain walls by electric current. The shift registers of this disclosure may be used for a random access memory device or a sequential access data storage device. The invention of the present disclosure provides domain wall nodes or anchors that stabilize a domain wall. An in-plane electric current de-pins the domain wall from the anchor and moves it to the next anchor.

In one particular embodiment, this disclosure provides a shift register having a track comprising a first magnetic material, the track comprising a domain for storing data. The shift register includes a first domain wall anchor and a second domain wall anchor, each comprising a second magnetic material electrically separated from the track. When an electric current is applied to the track, a domain wall shifts from the first anchor to the second anchor. The domain wall anchors may be separated from the track by an insulating layer or by a gap. More than two domain wall anchors may be present in the shift register.

In another particular embodiment, this disclosure provides a shift register having a substrate and a track comprising a domain for storing data on the substrate. The track is comprised of a magnetic material and has a thickness, a height from the substrate and a width, the track defining a first domain wall anchor and a second domain wall anchor, each anchor having a thickness, a height from the substrate and a width. More than two domain wall anchors may be present in the shift register. In this embodiment, the width for the anchors is the same as the width for the track.

In yet another particular embodiment, this disclosure provides a shift register having a substrate and a track comprising a domain for storing data on the substrate. The track is comprised of a magnetic material and has a thickness, a height from the substrate and a width, the track defining a first domain wall anchor and a second domain wall anchor, each anchor having a thickness, a height from the substrate and a width. More than two domain wall anchors may be present in the shift register. In this embodiment, the height from the substrate for the anchors is different than the height from the substrate for the track.

In still another particular embodiment, this disclosure provides a shift register having a track that has a domain for storing data. The track is comprised of a magnetic material. The track includes therein a first domain wall anchor and a second domain wall anchor, each anchor defined by a region of doped magnetic material in the track. More than two domain wall anchors may be present in the shift register.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The system of the present disclosure is a memory device that utilizes domain wall motion, based on spin electronics, to write and read data in ferromagnetic material. The shiftable magnetic shift register has a data track formed of a strip including ferromagnetic material. The track may be a physically uniform, magnetically homogeneous ferromagnetic material or layers of different ferromagnetic materials. Information is stored as direction of magnetic moment within the domains in the track. The track is magnetized in small sections, referred to herein as "domains", in one direction or another.

A domain wall is a concentration of a change in magnetism from one direction to another in a very small space. In a magnetic material with domain walls, a current passed across the domain wall moves the domain wall in the direction of the electron current flow, past a reading or writing element or device. As the electron current passes through a domain wall, the current exerts spin torque on the domain wall and then drags the domain wall to move with it. During the read and write processes, the physical nature of the magnetic material is unchanged.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. While the present disclosure is not so limited, an appreciation of various aspects of the disclosure will be gained through a discussion of the examples provided below.

Figure 11:
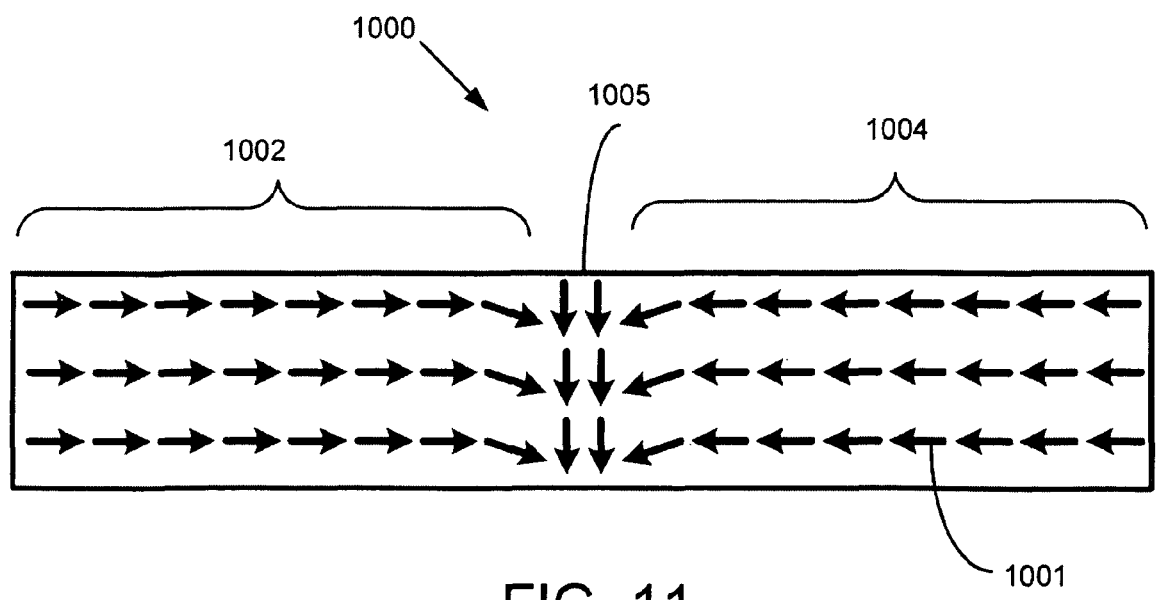
FIG. 11 is a schematic diagram of a magnetic material illustrating two domains and a domain wall.

In magnetic shift registers or shift tracks, data writing and reading is accomplished by moving magnetic domain walls by electric current. An in-plane electric current de-pins the domain wall and moves it to the next location. FIG. 11 illustrates the concept of domains and domain walls as used in conjunction with the present disclosure. FIG. 11 shows an exemplary magnetic material 1000 with two domains 1002, 1004 and a domain wall 1005. The arrows, such as arrow 1001, represent a magnetic moment, or dipole, and indicate local magnetization directions. The magnetic moments in domain 1002 point to the right, while the magnetic moments in domain 1004 point to the left. Domain wall 1005 is the region in which domains 1002, 1004 of opposite polarity meet. The change of magnetism between domain 1002 and domain 1004 is concentrated in the small domain wall 1005, creating a large dipolar fringing field emanating from the surface of the layer. This domain wall carries a data bit, either as a "0" or "1", depending on the direction of magnetic moment.

In addition to sequential access data storage devices, the general principle of shifting magnetic domain walls can be applied to random access memory, by moving the domain wall back and forth between two locations. The domain wall is preferably stabilized at a certain location during its idle mode. The present disclosure provides numerous embodiments for stabilizing a domain wall with wall anchors positioned at least in close proximity to the magnetic track. In some embodiments, the wall anchors are elements separate from the magnetic track. In other embodiments, the wall anchors are disturbances in the physical configuration of the magnetic track. In still other embodiments, the wall anchors are disturbances in the material of the magnetic track.

Figure 1:
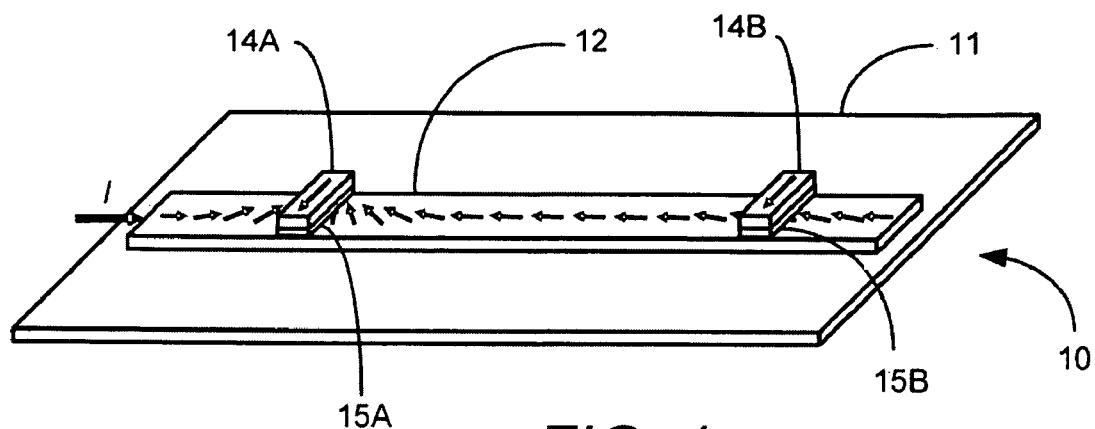
FIG. 1 is a perspective view of a first embodiment of a magnetic shift register with two domain wall storage anchors, the anchors being separate from and positioned proximate the magnetic track.
Figure 2:
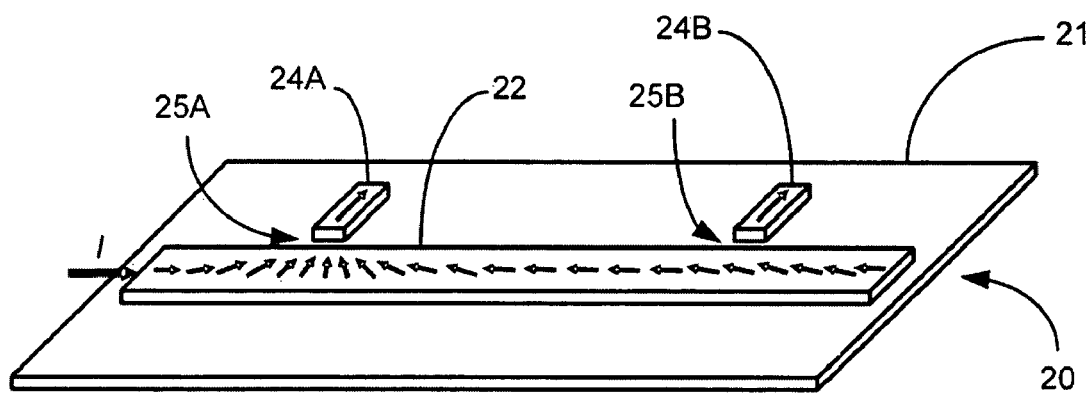
FIG. 2 is a perspective view of a second embodiment of a magnetic shift register with two domain wall storage anchors, the anchors being separate from and positioned proximate the magnetic track.
Figure 3:
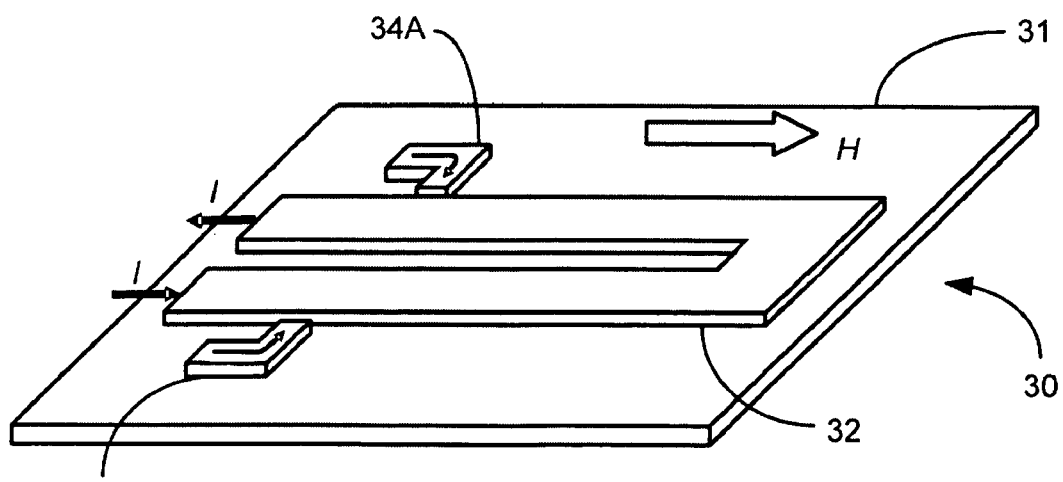
FIG. 3 is a perspective view of a third embodiment of a magnetic shift register with two domain wall storage anchors, similar to the embodiment of FIG. 2.

FIGS. 1, 2 and 3 illustrate three embodiments in accordance to this disclosure where the domain wall anchors are separate elements and are electrically spaced from the magnetic track. FIG. 1 illustrates a first embodiment of a shift register 10 having a substrate 11 with a magnetic track 12 thereon. Magnetic track 12 is formed from a relatively 'soft' magnetic material, a material with high momentum, low coercivity, low uniaxial anisotropy, and large exchange coupling, the magnetization of which can be altered by being exposed to a magnetic field. Examples of soft magnetic materials include ferromagnetic materials such as NiFe, CoFe, CoNiFe, and combinations thereof. Magnetic track 12 is usually about 50 nm-5 micrometers wide (although thinner and thicker tracks are suitable) with an extended length.

In close proximity to, yet electrically spaced from magnetic track 12 are domain wall anchors, in particular, a first domain wall anchor 14A and a second domain wall anchor 14B. Anchors 14A, 14B are from a magnetic material that is 'harder' than the 'soft' magnetic material of track 12. The magnetic material of anchors 14A, 14B may be a 'hard' or permanent magnet, the magnetization orientation of which does not change. Examples of permanent magnet materials include iron (Fe), chromium (Cr), cobalt (Co), nickel (Ni), platinum (Pt), vanadium (V), manganese (Mn), bismuth (Bi), and combinations thereof. Alternately, the magnetic material of anchors 14A, 14B is a 'soft' magnetic material, but harder than the material of track 12, in that a greater magnetic field is needed to alter the magnetization.

Anchors 14A, 14B are positioned proximate to track 12, in this embodiment, positioned on an upper surface of track 12 (i.e., on the surface opposite substrate 11). Anchors 14A, 14B are electrically spaced from and insulated from track 12 by an insulator layer, in particular a first insulator 15A and a second insulator 15B, respectively. Examples of suitable insulator materials include solid dielectric materials such as alumina (aluminum oxide) or silica (silicon dioxide). Stray fields from anchors 14A, 14B attract the domain wall and stabilize it proximate the anchor (e.g., anchor 14A or anchor 14B).

As illustrated in FIG. 1, the magnetic moments within track 12 meet at anchor 14A and form a head-to-head domain wall. As current I is passed through track 12, the current moves the domain wall in the direction of the current flow to second anchor 14B.

Alternate embodiments magnetic shift registers having domain wall anchors as separate elements that are electrically spaced from the magnetic track are illustrated in FIGS. 2 and 3. The general features of the various elements of the magnetic shift registers are similar or the same across the embodiments, unless otherwise indicated.

FIG. 2 illustrates a second embodiment of a magnetic shift register 20 having a substrate 21 with a magnetic track 22 thereon. Magnetic track 22 is formed from a 'soft' magnetic material, the magnetization of which can be altered by being exposed to a magnetic field. In close proximity to, yet electrically spaced from magnetic track 22 are domain wall anchors, in particular, a first domain wall anchor 24A and a second domain wall anchor 24B. Anchors 24A, 24B are from a magnetic material that is 'harder' than the 'soft' magnetic material of track 22. Anchors 24A, 24B are positioned proximate to track 22, in this embodiment, positioned to a side of track 22. Anchors 24A, 24B are electrically spaced from and insulated from track 12 by a space, in particular a first space 25A and a second space 25B, respectively. Spaces 25A, 25B are sufficient to allow a small amount of magnetization from anchors 24A, 24B to attract the domain wall and stabilize it proximate the anchor; spaces 25A, 25B are generally about 50-500 nm, depending on the width and thickness of the track.

The magnetic shift register embodiment 30 of FIG. 3 is similar to that of FIG. 2 in that it has a substrate 31 with a magnetic track 32 thereon. In this embodiment, however, magnetic track 32 has a non-linear, "U" shape. In close proximity to, yet electrically spaced from magnetic track 32 are domain wall anchors, in particular, a first domain wall anchor 34A and a second domain wall anchor 34B. Anchors 34A, 34B are positioned to a side of track 32, one on each arm of the "U". Anchors 34A, 34B are electrically spaced from and insulated from track 32 by a space, in particular a first space 35A and a second space 35B, respectively. In this embodiment, an external magnetic field H is present. When an external magnetic field is applied, a domain wall is generated at one of the corners of the "U" track 32. After removing the field, although the domain wall will exist, it is not as stable as if proximate anchor 34A or 34B. A current applied will move the domain wall to one of anchors 43A, 34B.

In this embodiment, anchors 34A, 34B are illustrated as having a right angle within the anchor. This may be done, for example, to improve the utilization of space on substrate 31 proximate track 32. Similarly, track 32 may be non-linear or "U" shaped to improve the utilization of space on substrate 32. It is to be understood that any of the embodiments within this disclosure may have right angle anchors and/or non-linear or "U" shaped tracks.

Figure 4:
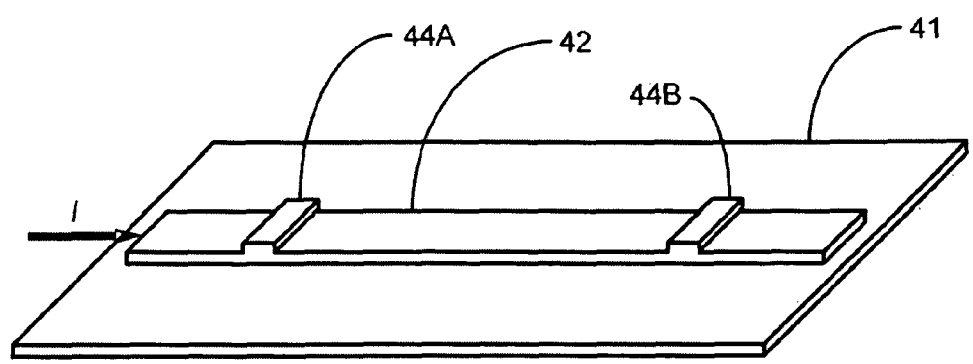
FIG. 4 is a perspective view of a fourth embodiment of a magnetic shift register with two domain wall storage anchors, the anchors being incorporated into the magnetic track.
Figure 5:
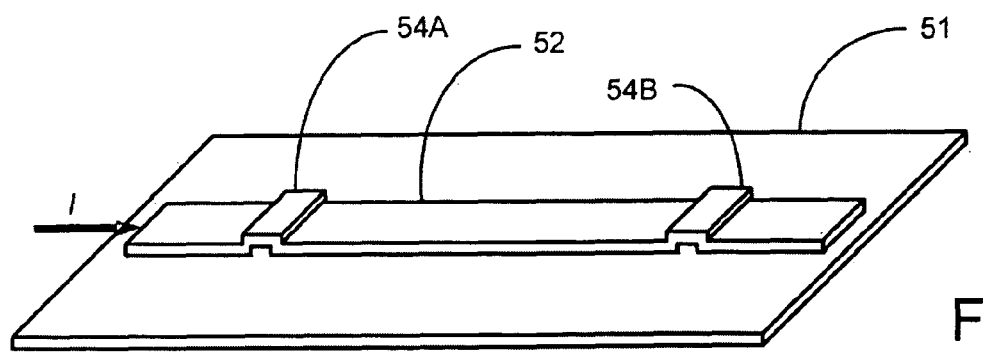
FIG. 5 is a perspective view of a fifth embodiment of a magnetic shift register with two domain wall storage anchors, the anchors being incorporated into the magnetic track.
Figure 6:
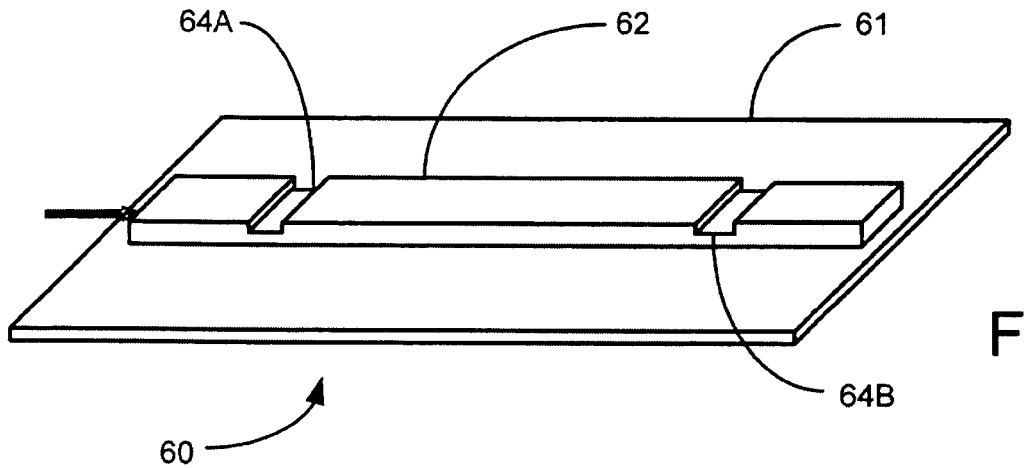
FIG. 6 is a perspective view of a sixth embodiment of a magnetic shift register with two domain wall storage anchors, the anchors being incorporated into the magnetic track.

FIGS. 4, 5 and 6 illustrate three embodiments in accordance to this disclosure where the domain wall anchors are electrically connected to and integral with the magnetic shift register track. By use of the term "integral", what is intended is that the anchors are within the track and are not elements separate from the track, as are the embodiments of FIGS. 1 through 3. Integral anchors may be made concurrently with the track or sequentially with the track (e.g., the anchors may be formed after the track is formed). In these embodiments of FIGS. 4 through 6, the track has a height from the substrate and a thickness, and the anchors each have a height from the substrate and a thickness. The anchors have a different height and/or thickness than the track. The width of the track and the anchors are equal or uniform.

Figure 4A:
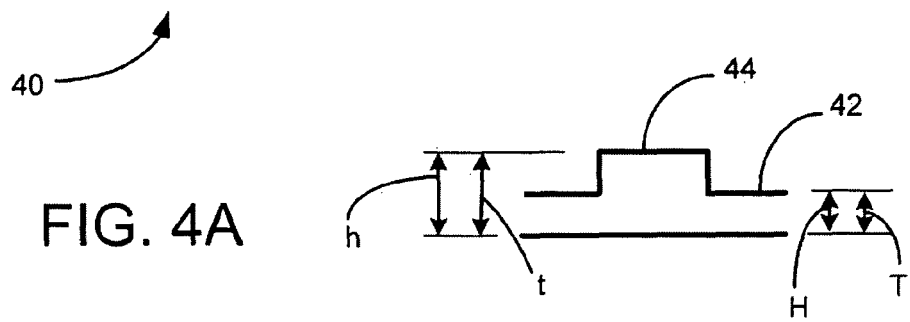
FIG. 4A is a side view of a portion of the magnetic track and one anchor of FIG. 4.

In FIG. 4, a magnetic shift register 40 has a substrate 41 with a magnetic track 42 thereon. Within track 42 are a first domain wall anchor 44A and a second domain wall anchor 44B. Anchors 44A, 44B are protrusions above the level of track 42. A side view of a generic domain wall anchor 44 and a portion of track 42 is seen in FIG. 4A. Track 42 has a height H (measured from substrate 41) and a thickness T. Anchor 44 has a height h (measured from substrate 41) and a thickness t. For shift register 40, track 42 has a uniform height H and thickness T and anchor 44 has a uniform height h and thickness t; that is height H is equal to thickness T and height h is equal to thickness t. Height H and thickness T are different from height h and thickness t, and in this embodiment, height H and thickness T are less than height h and thickness t. The width of track 42 and anchor 44, across track 42, are equal; that is, the width of the extension of track 42 and anchor 44 is uniform and the side edge of track 42 with anchors 44A, 44B is linear.

Figure 5A:
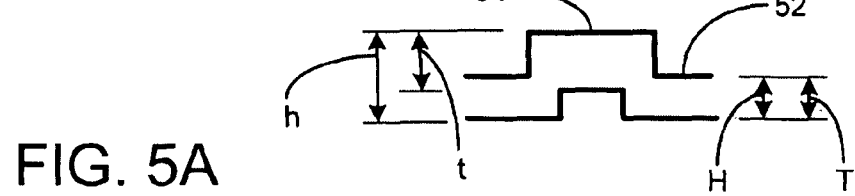
FIG. 5A is a side view of a portion of the magnetic track and one anchor of FIG. 5.

In FIG. 5, a magnetic shift register 50 has a substrate 51 with a magnetic track 52 thereon. Within track 52 are a first domain wall anchor 54A and a second domain wall anchor 54B. Anchors 54A, 54B are protrusions above the level of track 52. A side view of a generic domain wall anchor 54 and a portion of track 52 is seen in FIG. 5A. Track 52 has a height H (measured from substrate 51) and a thickness T. Anchor 54 has a height h (measured from substrate 51) and a thickness t. For shift register 50, track 52 has a uniform height H and thickness T, yet anchor 54 has a different height h than thickness t. In this embodiment, height h is greater than height H and thickness T. Height H and thickness T may or may not be different than thickness t. Further, thickness t may or may not be greater than height H and thickness T. The width of track 52 and anchor 54, across track 52, are equal; that is, the width of the extension of track 52 and anchor 54 is uniform and the side edge of track 52 with anchors 54A, 54B is linear.

Figure 6A:
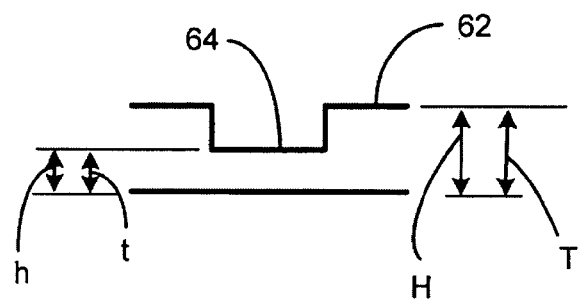
FIG. 6A is a side view of a portion of the magnetic track and one anchor of FIG. 6.

In FIG. 6, a magnetic shift register 60 has a substrate 61 with a magnetic track 62 thereon. Within track 62 are a first domain wall anchor 64A and a second domain wall anchor 64B. Anchors 64A, 64B are indents or recesses below the level of track 62. A side view of a generic domain wall anchor 64 and a portion of track 62 is seen in FIG. 6A. Track 62 has a height H (measured from substrate 61) and a thickness T. Anchor 64 has a height h (measured from substrate 61) and a thickness t. For shift register 60, track 62 has an equal height H and thickness T and anchor 64 has an equal height h and thickness t. Height H and thickness T are different from height h and thickness t. In this embodiment, height H and thickness T are greater than height h and thickness t. The width of track 62 and anchor 64, across track 62, are equal; that is, the width of the extension of track 62 and anchor 64 is uniform and the side edge of track 62 with anchors 64A, 64B is linear.

Figure 7:
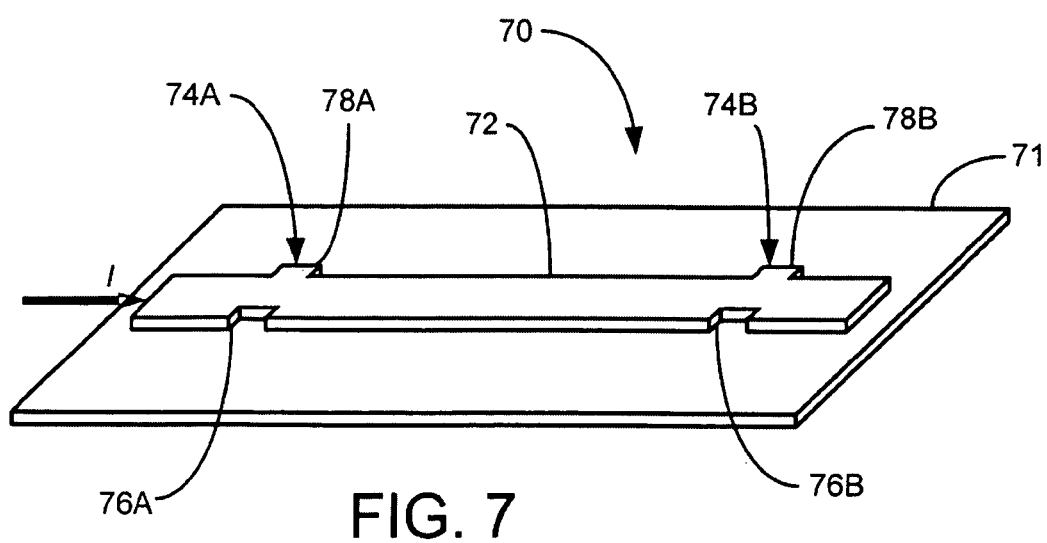
FIG. 7 is a perspective view of a seventh embodiment of a magnetic shift register with two domain wall storage anchors, the anchors being incorporated into the magnetic track.

FIG. 7 illustrates an embodiment in accordance to this disclosure where the domain wall anchors are integral with the magnetic shift register track. In this embodiment, the anchors have the same height, thickness and width as the track. In FIG. 7, a magnetic shift register 70 has a substrate 71 with a magnetic track 72 thereon. Within track 72 are a first domain wall anchor 74A and a second domain wall anchor 74B. Anchors 74A, 74B are a protrusion and a recess into the side or width of track 72. Anchor 74A includes a recess 76A into track 72 and a protrusion 78A out from track 72; anchor 74B includes a recess 76B into track 72 and a protrusion 78B out from track 72. In this particular embodiment, recess 76A, 76B is equal to protrusion 78A, 78B, so that the overall width of anchors 74A, 74B is the same as the width of track 72; the width of the extension of track 72 and anchors 74A, 74B is constant, although not linear. The height across track 72 and anchors 74A, 74B is constant.

Figure 8A:
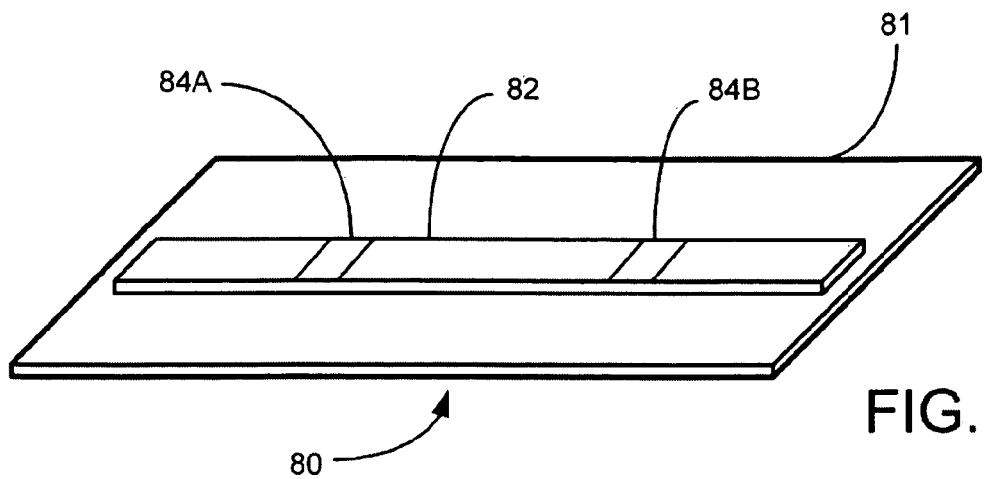
FIG. 8A is a perspective view of an eighth embodiment of a magnetic shift register with two domain wall storage anchors, the anchors being incorporated into the magnetic track.

In the previous embodiments of FIGS. 4 through 7, the domain wall anchors were formed of the same magnetic material as the track. FIG. 8A illustrates an embodiment of a magnetic shift register track having domain wall anchors integral with the track but that have a change in the magnetic material that forms the track. The magnetization property of the track is different, preferably increased, in the region of the anchors. Alternately or additionally, the exchange coupling strength in the region of the anchors is increased.

Referring to FIG. 8A, a magnetic shift register 80 has a substrate 81 with a magnetic track 82 thereon. Within track 82 are a first domain wall anchor 84A and a second domain wall anchor 84B. Anchors 84A, 84B are regions magnetic material having a dopant present. The dopant can increase or decrease the magnetization at anchors 84A, 84B. In this embodiment, there is little to no dimensional change between track 82 and anchors 84A, 84B, with the width, height and thickness of track 82 being constant across the regions having anchors 84A, 84B.

The dopant may be, for example, applied (e.g., deposited) onto track 82 and then diffused into the magnetic material (for example, facilitated by heating) to form anchors 84A, 84B.

Figure 8B:
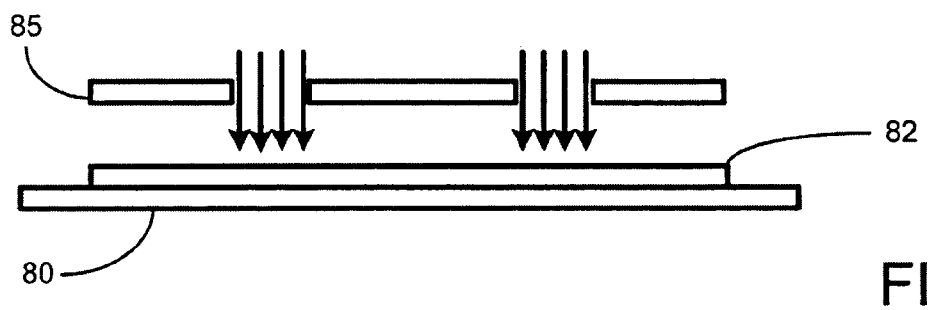
FIG. 8B is a side view of a method of making the shift register of FIG. 8A.

FIG. 8B illustrates a schematic side view of a process for implanting dopant into the magnetic material to form the anchors. Magnetic material forming track 82 is illustrated present on substrate 80. A mask 85 can be used to define regions where anchors 84A, 84B are to be located. Dopant material can be applied into track 82 through mask 85 to form anchors 84A, 84B. Such a mask may also be used when depositing dopant or doped material onto the track.

Figure 9:
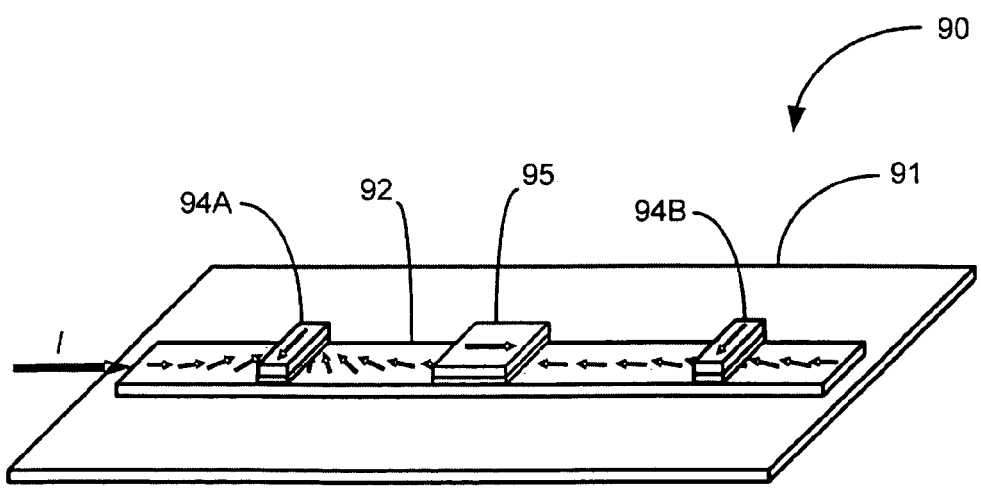
FIG. 9 is a perspective view of a ninth embodiment of a magnetic shift register with two domain wall storage anchors, the anchors being separate from and positioned proximate the magnetic track, with the magnetic shift register including a magnetic tunnel junction.

FIG. 9 illustrates a magnetic shift register track including a data reading element incorporated with the track. Reading the data on the magnetic shift register can be accomplished, for example, using a magnetic tunneling junction. In FIG. 9, a substrate 90 has a magnetic track 92 having a first anchor 94A and a second anchor 95B. Positioned proximate track 92 between anchor 94A and anchor 94B is a magnetic tunnel junction 95.

Magnetic tunneling junction 95 has two magnetic materials separated by a very thin insulating or tunneling barrier. The magnitude of any current passed through the tunneling barrier depends on the relative magnetization orientation of the two magnetic materials in the tunneling junction. Consequently, the value of the current in tunneling junction 95 indicates the direction of the magnetic moment in the magnetic shift register that is being read. Magnetic tunnel junctions are described, for example, in co-pending application Ser. No. 12/106,363, filed Apr. 21, 2008.

By including a magnetic tunnel junction in conjunction with the magnetic shift register, information stored in the domains in the magnetic shift register can be read by the current that passes through the magnetic tunnel junction. As the domains flow pass the magnetic tunneling junction, the magnitude of the current indicates the value stored by the direction of the domain, thus reading the domain.

The various embodiments discussed above have included two domain wall anchors; magnetic shift registers in accordance with this disclosure could have more than two domain wall anchors. In general, two domain wall anchors are desired for random access memory, where the domain wall switches back and forth between the two anchors. More than two anchors are desired for sequential access data storage devices.

Figure 10:
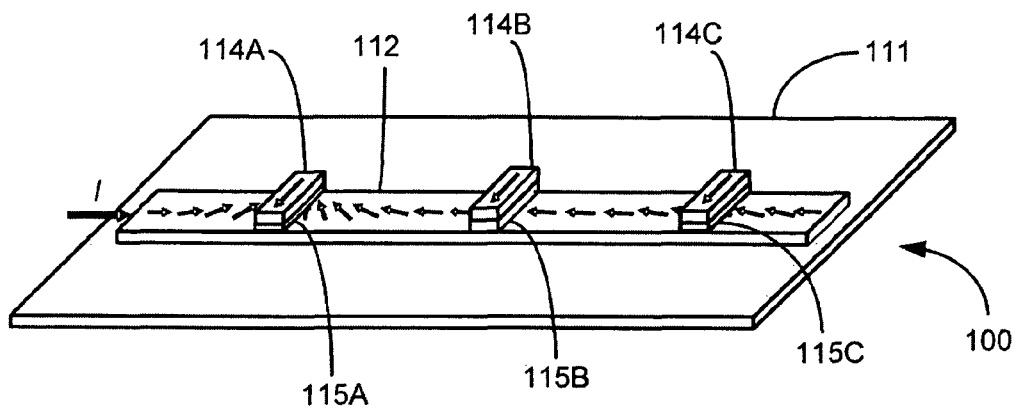
FIG. 10 is a perceptive view of a tenth embodiment of a magnetic shift register with more than two domain wall storage anchors, in this embodiment, three domain wall storage anchors, similar to the embodiment of FIG. 1.

FIG. 10 illustrates a variant having more than two domain wall anchors, in particular, three domain wall anchors. Referring to FIG. 10, a magnetic shift register 100 has a substrate 111 with a magnetic track 112 thereon. In close proximity to, yet electrically spaced from magnetic track 112 are domain wall anchors, in particular, a first domain wall anchor 114A, a second domain wall anchor 114B and a third domain wall anchor 114C. Anchors 114A, 114B, 114C are positioned proximate to track 112, in this embodiment, as in shift register 10 of FIG. 1, positioned on an upper surface of track 112 (i.e., on the surface opposite substrate 111). Anchors 114A, 114B, 114C are electrically spaced from and insulated from track 112 by an insulator layer, in particular a first insulator 115A, a second insulator 115B, and a third insulator 115C respectively.

It should be understood that any of the embodiments illustrated and discussed above with two domain wall anchors (for random access memory devices) could be modified to have more than two anchors, for example, three anchors, four anchors, etc. (for sequential access data storage devices).

The various embodiments of magnetic shift tracks described above can be made using conventional wafer processing techniques, including physical vapor deposition, chemical vapor deposition, photolithography or other thin film processing techniques.

The various embodiments of magnetic shift tracks described above can be used by many different applications that utilize spintronics, including but not limited to, magnetic random access memories; magnetic recording hard disk drives; magnetic logic devices; security cards using magnetically stored information; semiconductor devices wherein large magnetic fields provided by domain walls can be used to locally vary the electronic properties of the semiconductor or semiconductor heterostructure; mesoscopic devices, which are sufficiently small that the electronic energy levels, therein, can be substantially affected by the application of local magnetic fields; and so forth.

Thus, embodiments of the MAGNETIC TRACKS WITH DOMAIN WALL STORAGE ANCHORS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A shift register comprising:
   a track comprising a first magnetic material, the track comprising a domain for storing data; and
   a first domain wall anchor and a second domain wall anchor, each consisting essentially of a second magnetic material, the first and second domain wall anchors positioned proximate and electrically separated from the track;
   wherein when an electric current is applied to the track, a domain wall shifts from the first anchor to the second anchor.

2. The shift register of claim 1 wherein the anchors are electrically separated from the track by an insulator layer.

3. The shift register of claim 2 wherein the anchors are positioned adjacent the track with the insulator layer therebetween.

4. The shift register of claim 3 wherein the first magnetic material is a softer magnetic material than the second magnetic material.

5. The shift register of claim 2 wherein the anchors are physically spaced from the track.

6. The shift register of claim 5 wherein the anchors are positioned to a side of the track.

7. The shift register of claim 6 wherein the anchors are about 50-500 nm from the side of the track.

8. The shift register of claim 6 wherein the first magnetic material is a softer magnetic material than the second magnetic material.

9. The shift register of claim 6 wherein the anchors comprise a right angle.

10. The shift register of claim 1 wherein the track is non-linear.

11. The shift register of claim 1 further comprising a magnetic tunnel junction between the first anchor and the second anchor.

12. The shift register of claim 1 further comprising a third domain wall anchor comprising the second magnetic material positioned proximate and electrically separated from the track.

13. A shift register comprising:
   a substrate;
   a track comprising a domain for storing data on the substrate, the track comprising a magnetic material and having a thickness, a height from the substrate and a width, the track defining a first domain wall anchor and a second domain wall anchor, each anchor consisting essentially of a second magnetic material, and each anchor being electrically separated from the track and having a thickness, a height from the substrate and a width;

wherein the width of the anchors is uniform with the width of the track.

14. The shift register of claim 13, wherein the width of the anchors and the width of the track are linear.

15. The shift register of claim 14, wherein the height from the substrate for the anchors is different than the height from the substrate for the track.

16. The shift register of claim 15, wherein the height of the anchors is greater than the height of the track.

17. The shift register of claim 16, wherein the thickness of the track and the thickness of the anchors are different.

18. The shift register of claim 15, wherein the height of the anchors is less than the height of the track.

19. The shift register of claim 18, wherein the thickness of the track and the thickness of the anchors are different.

20. The shift register of claim 13, wherein the thickness of the track and the thickness of the anchors are the same, and the height from the substrate for the anchors is different than the height from the substrate for the track.

21. The shift register of claim 13, wherein:
the width for the anchors and the width for the track are equal but continuous and non-linear; and
the thickness of the anchors and the thickness of the track are the same.

22. The shift register of claim 13 wherein the track is non-linear.

23. The shift register of claim 13 further comprising a magnetic tunnel junction between the first anchor and the second anchor.

24. The shift register of claim 13, the track further defining a third domain wall anchor having a thickness, a height from the substrate and a width, wherein the width of the third anchor is uniform with the width of the track.

* * * * *